United States Patent
Tilton et al.

(10) Patent No.: US 6,952,346 B2
(45) Date of Patent: Oct. 4, 2005

(54) ETCHED OPEN MICROCHANNEL SPRAY COOLING

(75) Inventors: Charles L. Tilton, Colton, WA (US); Donald E. Tilton, Colton, WA (US)

(73) Assignee: Isothermal Systems Research, Inc, Liberty Lake, WA (US)

( * ) Notice: Subject to any disclaimer, the term of this patent is extended or adjusted under 35 U.S.C. 154(b) by 4 days.

(21) Appl. No.: 10/786,451

(22) Filed: Feb. 24, 2004

(65) Prior Publication Data

US 2005/0185378 A1 Aug. 25, 2005

(51) Int. Cl.$^7$ ............................................. H05K 7/20
(52) U.S. Cl. ..................... 361/699; 257/714; 165/80.4; 174/15.1; 62/259.2
(58) Field of Search ................................ 361/699, 700; 257/714, 715; 174/15.1; 165/80.4, 104.26; 62/259.2

(56) References Cited

U.S. PATENT DOCUMENTS

| | | | |
|---|---|---|---|
| 4,352,392 A | 10/1982 | Eastman | |
| 4,450,472 A | 5/1984 | Tuckerman et al. | |
| 4,567,505 A | 1/1986 | Pease et al. | |
| 5,183,104 A | 2/1993 | Novotny | |
| 5,220,804 A | 6/1993 | Tilton et al. | |
| 5,247,426 A | 9/1993 | Hamburgen et al. | |
| 5,263,536 A | 11/1993 | Hulburd et al. | |
| 5,675,473 A | 10/1997 | McDunn et al. | |
| 5,718,117 A | 2/1998 | McDunn et al. | |
| 5,719,444 A | 2/1998 | Tilton et al. | |
| 5,768,103 A | 6/1998 | Kobrinetz et al. | |
| 5,901,037 A | 5/1999 | Hamilton et al. | |
| 5,924,482 A | 7/1999 | Edwards et al. | |
| 5,959,351 A | 9/1999 | Sasaki et al. | |
| 6,108,201 A | 8/2000 | Tilton et al. | |
| 6,205,799 B1 | 3/2001 | Patel et al. | |
| 6,349,554 B2 | 2/2002 | Patel et al. | |
| 6,550,263 B2 | 4/2003 | Patel et al. | |
| 6,571,569 B1 | 6/2003 | Rini et al. | |
| 6,580,610 B2 | 6/2003 | Morris et al. | |
| 6,604,370 B2 | 8/2003 | Bash et al. | |
| 6,606,251 B1 | 8/2003 | Kenny, Jr. et al. | |
| 6,612,120 B2 | 9/2003 | Patel et al. | |
| 6,650,542 B1 | 11/2003 | Chrysler et al. | |
| 6,667,548 B2 | 12/2003 | O'Connor et al. | |
| 6,678,168 B2 | 1/2004 | Kenny, Jr. et al. | |
| 2004/0093887 A1 * | 5/2004 | Shyy et al. | ................ 62/259.2 |
| 2005/0041393 A1 * | 2/2005 | Tustaniwskyi et al. | ..... 361/699 |

OTHER PUBLICATIONS

Bash et al, Inkjet Assisted Spray Cooling of Electronics, ASME IPACK03—International Electronics Packaging Technical Conference and Exhibition, Jul. 6–11, 2003, Maui, Hawaii.

Tilton, Spray Cooling, Doctorial Dissertation—University of Kentucky, Lexington, Kentucky, 1989.

* cited by examiner

Primary Examiner—Boris Chérvinsky
(74) Attorney, Agent, or Firm—Paul A. Knight

(57) ABSTRACT

The present invention is a spray cooling thermal management device that cools an electronic component. Liquid coolant is dispensed upon a heated surface containing etched open microchannels.

10 Claims, 6 Drawing Sheets

VAPOR OUT

LIQUID & VAPOR IN

FLUID OUT

ETCHED OPEN MICROCHANNEL SPRAY COOLING

CROSS REFERENCE TO RELATED APPLICATIONS

None

STATEMENT REGARDING FEDERALLY SPONSORED RESEARCH OR DEVELOPMENT

Not applicable.

BACKGROUND

1. Field of the Invention

The present invention relates generally to spray cooling thermal management systems and more specifically it relates to a spray cooling system that has improved thermal performance through the use of etched open mircochannels.

2. Description of the Related Art

Liquid cooling is well known in the art of cooling electronics. As air cooling heat sinks continue to be pushed to new performance levels, so has their cost, complexity, and weight. For some time, liquid cooling solutions have been developed and tested, but other than specialty applications they have yet to gain widespread commercial adoption. As computer power consumptions continue to increase, liquid cooling will provide significant advantages to computer manufacturers which will force its use. The present invention provides significant advantages over both air cooling and prior art liquid cooling solutions.

Liquid cooling technologies use a cooling fluid for removing heat from an electronic component. Liquids can hold and transfer heat at a rate many times that of air. Single-phase liquid cooling systems place a pure liquid in thermal contact with the component to be cooled. With these systems, the cooling fluid absorbs heat as sensible energy. Other liquid cooling systems, such as spray cooling, are two-phase processes. In these systems, heat is absorbed by the cooling fluid as latent energy gains. Two-phase cooling, or commonly referred to as evaporative cooling, provides the ability to deliver more efficient, more compact and higher performing liquid cooling systems than single-phase systems.

An exemplary two-phase cooling method is spray cooling. Spray cooling uses a pump for supplying fluid to one or more nozzles that transform the coolant supply into droplets. These droplets impinge the surface of the component to be cooled and can create a thin coolant film. Energy is transferred from the surface of the component to the thin-film. Because the fluid is dispensed at or near its saturation point, the absorbed heat causes the thin-film to turn to vapor. This vapor is then condensed, often by means of a heat exchanger, or condenser, and returned to the pump.

Significant efforts have been expended in the development and optimization of spray cooling. A doctorial dissertation to Tilton entitled "Spray Cooling" (1989), available through the University of Kentucky library system, describes how optimization of spray cooling system parameters, such as droplet size, distribution, and momentum can create a thin coolant film capable of absorbing high heat fluxes. As described by the Tilton dissertation, atomization plays a key role in the development of a thin coolant film capable of absorbing very high heat fluxes, such as a coolant film capable of absorbing a heat flux over 800 watts per square centimeter. Research and development by Isothermal Systems Research (ISR) has shown spray cooling to be capable of absorbing heat fluxes in the range of several thousands watts per square centimeter.

In addition to the system parameters described by the Tilton dissertation, U.S. Pat. No. 5,220,804 provides a method of increasing a spray cooling system's ability to remove heat. The '804 patent describes a method of managing system vapor that further thins the coolant film which increases evaporation, improves convective heat transfer, and liquid and vapor reclaim.

Historically, most electronic cooling solutions have provided wide area treatment of the cooling surface. Electronic components are rated to a total wattage that is spread by an aluminum, copper, or diamond heat spreader to the cooling fluid (may be air or liquid). In some applications, this wide-area average heat flux treatment of the cooling surface only marginally takes advantage of the benefits of liquid cooling over air cooling.

Electronic components create varying amounts of heat across their surfaces and a varying amount of heat as a function of time. Today's microprocessors, for example, may be constructed on a silicon die roughly 1 cm by 1 cm. The die may have multiple zones for different functions. Such zones may be for inputs and outputs (I/Os), level 1 cache, level 2 cache, and the core. The core may be roughly 0.5 cm by 0.5 cm and is where the main computer processing takes place. Although the core may only be 25% of the total area of the die, it creates almost the entire heat generation by the chip and may be considered a chip "hotspot". Wherein a chip might be rated for an average heat load of 110 watts, with an average heat flux of 110 wafts per centimeter squared, the core may generate 100 watts of that heat and have a heat flux of 400 watts per centimeter squared. This non-uniform heat flux distribution poses a significant challenge to the cooling system as it is desirable to keep the entire chip at nearly the same operating temperature. Cooling systems that rely on heat spreading may not provide this ability as they rely on conduction spreading, resulting in significant temperature gradients across the chip.

One method of cooling the core of a computer chip is to divide the chip into thermal zones and to cool each of the chip's zones at a different rate. U.S. Pat. No. 6,443,323, describes a method of variably cooling a computer component through the use of incremental sprayers. The incremental sprayers deposit fluid onto each zone at a mass flow rate necessary for complete phase change. Drops are ejected from an orifice in serial. Although this method improves the efficiency of the system, that is in attaining complete phase change of all dispensed fluid, the incremental dispensing method does not provide dispensing characteristics necessary to create high heat flux thin-film evaporative cooling and high performance cooling of hotspots. A paper by Don Tilton and Jay Ambrose (1989), entitled "Closed-System, High-Flux Evaporative Spray Cooling", describes the early development and analysis of incremental sprayers and predicts a maximum heat flux capability of around 300 watts per centimeter squared using water. An ASME paper published by Bash, Patel, and Sharma entitled "Inkjet Assisted Spray Cooling of Electronics" (2003), describes an inkjet dispensing system with a critical heat flux of around 270 wafts per centimeter squared using water.

Another method of cooling the core is described by U.S. Pat. No. 6,650,542. Although this method directs and controls the single phase fluid over a chip hotspot, the disclosed method is not a phase change process and thus not capable of high heat flux thin-film evaporative cooling.

Yet another method of cooling the core is two-phase microchannels, such as described by U.S. Pat. No. 4,450,472. Although this method does not use spray cooling, the design does provide the ability to remove heat in the range of 400–1000 watts per square centimeter using water. The system discloses a method of placing a very small microchannel array on an electronic component. Although microchannel cooling methods may effectively lower the temperature of the core, due to large pressure drops and resulting size limitations they do not efficiently address the needs of the non-hotspot areas of the die.

For the foregoing reasons, there is a need for a liquid cooling solution that effectively cools the one or more hotspots of a computing component. Thus, there is a need for a localized cooling solution capable of absorbing large heat fluxes. Also, the high heat flux cooling system must efficiently and reliably cool the other non-high heat flux areas of the chip. The resulting cooling solution would allow significant improvements in processor performance.

BRIEF SUMMARY OF THE INVENTION

In order to solve the problems of the prior art, and to provide a spray cooling solution that significantly changes the thermal constraints of the core, a hotspot spray cooling solution has been developed.

The present invention is a spray cooling thermal management device that cools an electronic component creating a varying amount of heat across its surfaces. Liquid coolant is dispensed upon the surface of the component. In areas of the chip that generate large heat fluxes, typically referred to as the core, the liquid coolant is dispensed as a continuous atomized droplet pattern. The atomized pattern creates a high heat flux evaporative cooling thin-film over the one or more core areas. Rather than optimize the atomized pattern and flow based upon complete thin-film vaporization, the present invention optimizes the atomized pattern for maximum heat removal rates. Any excess, non-vaporized, fluid flowing outward from the hotspot is used to cool the lower heat flux (non-core)-areas of the component through the creation of a thick coolant film thereon.

Other embodiments of the invention include supplemental nozzles that deposit cooling fluid into the thick-film. This embodiment provides an efficient and simple method of controlling the cooling rates over the less critical system zones and provides further flexibility in optimizing the atomization for the high heat flux areas.

Another embodiment of the present invention utilizes an atomizer that dispenses the coolant at a non-perpendicular angle to one or more component hotspots. This embodiment provides directional control of the excess fluid of the hot spot. The thick-film is encouraged to flow in a predetermined direction.

Another embodiment of the present invention uses a liquid-vapor separator for separating liquid and vapor from the exit stream of a spray module prior to condensing the vapor. The result is a near pure vapor at the inlet of the condenser which is potentially more efficient and has a more repeatable performance than a condenser with substantial two-phase flow at its inlet.

Yet another embodiment of the present invention enhances the surface of the chip to be spray cooled through the use of etched open microchannels. These microchannels are formed either directly into the top surface of the chip or through the use of a secondary etched microchannel plate bonded to the top surface of the chip.

These and other features, aspects, and advantages of the present invention will become better understood with regard to the following description, and accompanying drawings.

BRIEF DESCRIPTION OF THE DRAWINGS

In the course of the detailed description to follow, reference will be made to the attached drawings. These drawings show different aspects of the present invention and, where appropriate, reference numerals illustrating like structures, components, and/or elements in different figures are labeled similarly. It is understood that various combinations of the structures, components, and/or elements other than those specifically shown are contemplated and within the scope of the present invention.

DETAILED DESCRIPTION OF THE PREFERRED EMBODIMENTS

Many of the fastening, connection, manufacturing and other means and components utilized in this invention are widely known and used in the field of the invention are described, and their exact nature or type is not necessary for a person of ordinary skill in the art or science to understand the invention; therefore they will not be discussed in detail.

Applicant hereby incorporates by reference the following U.S. patents: U.S. Pat. No. 5,220,804 for a high heat flux evaporative cooling system; and U.S. Pat. No. 5,860,602 and U.S. Pat. No. 6,016,969, each for a laminated array of pressure swirl atomizers, and U.S. Pat. No. 6,108,201 for a fluid control apparatus and method for spray cooling and U.S. patent application Ser. No. 10/281,391 for an actuated atomizer. Although a laminated pressure swirl atomizer array is hereby incorporated by reference and shown in the accompanying drawings, the present invention is not limited to such an apparatus, in fact, many dispensing means are applicable to the present invention, including but not limited to, inserted atomizers, jet orifices, and actuated atomizers. Applicant herein incorporates by reference co-pending U.S.

patent application entitled "Hotspot Coldplate Spray Cooling System", also filed on Feb. 24, 2004. This application is related to co-pending U.S. patent application entitled "Hotspot Spray Cooling", also filed on Feb. 24, 2004.

Figure 1:
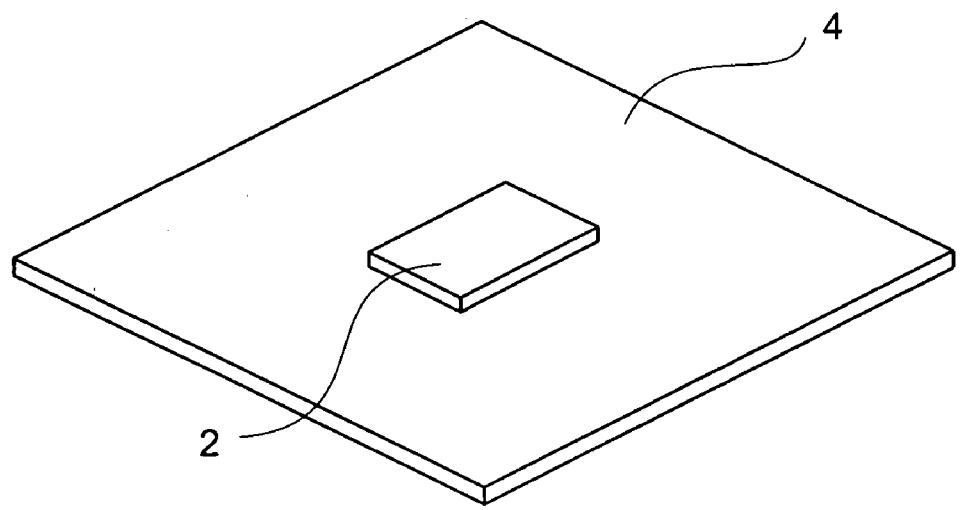
FIG. 1 is a perspective view of a computer chip mounted onto a substrate.

Now referring to FIG. 1, a computer chip 2 is shown mounted to a substrate 4, as typical in computing applications. Computer chip 2 may be a microprocessor, Field Programmable Gate Array (FPGA), Application Specific Integrated Circuit (ASIC), or any other commonly used electronic component. Chip 2 is attached to substrate 4 using any one of a wide range of commonly known packaging technologies (not shown), including: ball grid array, pin grid array, land grid array, and wirebond. The present invention is not limited to any one particular interconnect or packaging method.

Figure 2:
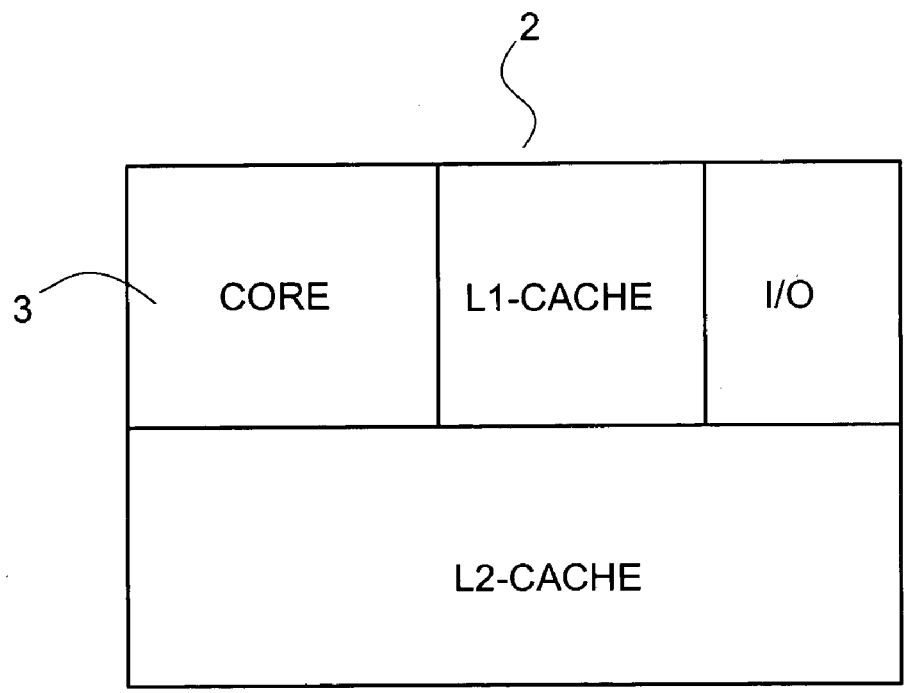
FIG. 2 is a top view of computer chip with multiple zones.

FIG. 2 shows a typical microprocessor version of chip 2. The top surface of chip 2 has several zones, each with a unique function, unique power consumption, and thus, a unique heat generation rate. Although multiple zones are identified by FIG. 2, they can be lumped into high and low heat flux zones. Low heat generation zones may be, but are not limited to, memory (L1 and L2 cache), I/Os and controllers. A core 3, where significant computations take place, generates heat at a much greater rate than the low heat generation zones. A chip may have multiple hotspots as areas of execution and floating point calculations may be done in separate locations on the die, each hotspot located over a core.

Figure 3:
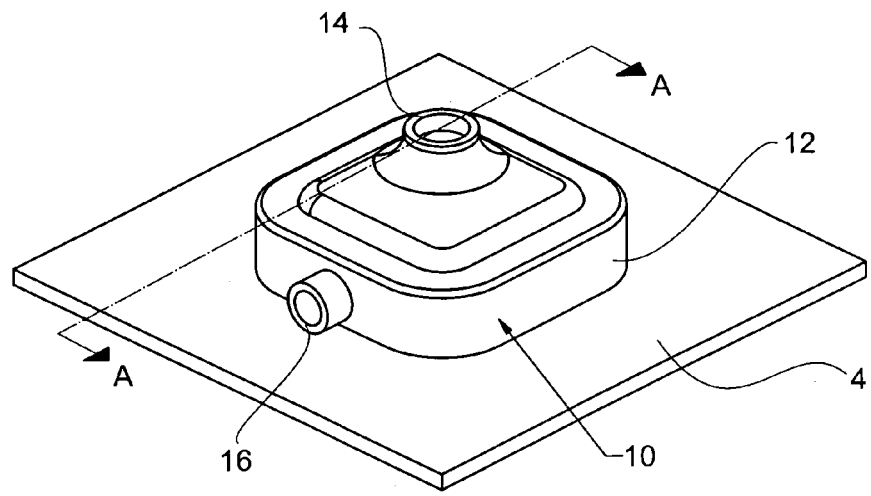
FIG. 3 is a perspective view of a spray module mounted onto the substrate and encompassing the chip from FIG. 1.

FIG. 3, and according to the present invention, shows a spray module 10 attached to substrate 4 and encompassing chip 2. Spray module 10 may be attached to substrate 4 through the use of adhesives, soldering, or mechanical fastening such as but not limited to the methods described by U.S. Pat. No. 6,108,201 incorporated herein by this reference. Spray module 10 is used for dispensing a supply of liquid coolant onto the surface of chip 2. Fluid enters module 10 through an inlet 14 and exits through an outlet 16. Although only one outlet 16 is shown, multiple are possible. In fact, wherein computer desktops are most often orientated in one of two orientations, desktop or tower, it may be preferable to have a plurality of outlet 16 at ninety degree angles to each other.

Figure 10:
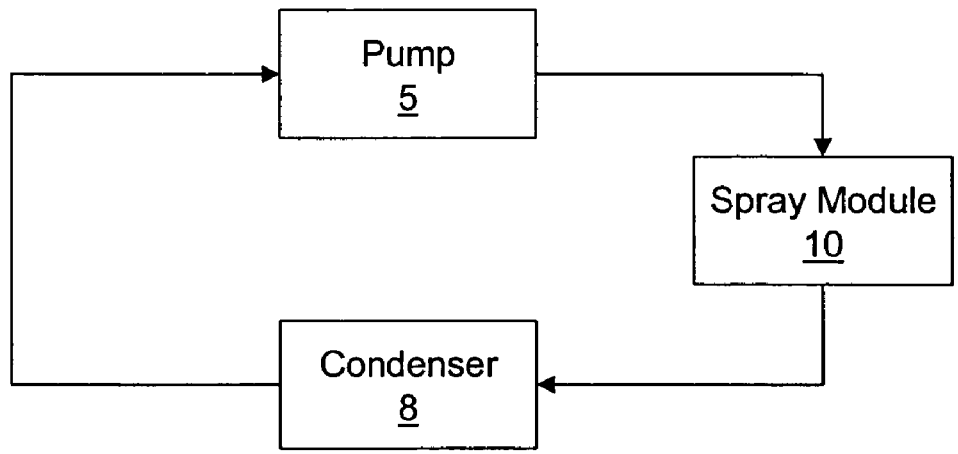
FIG. 10 is a block diagram of a simple spray cool system.
Figure 11:
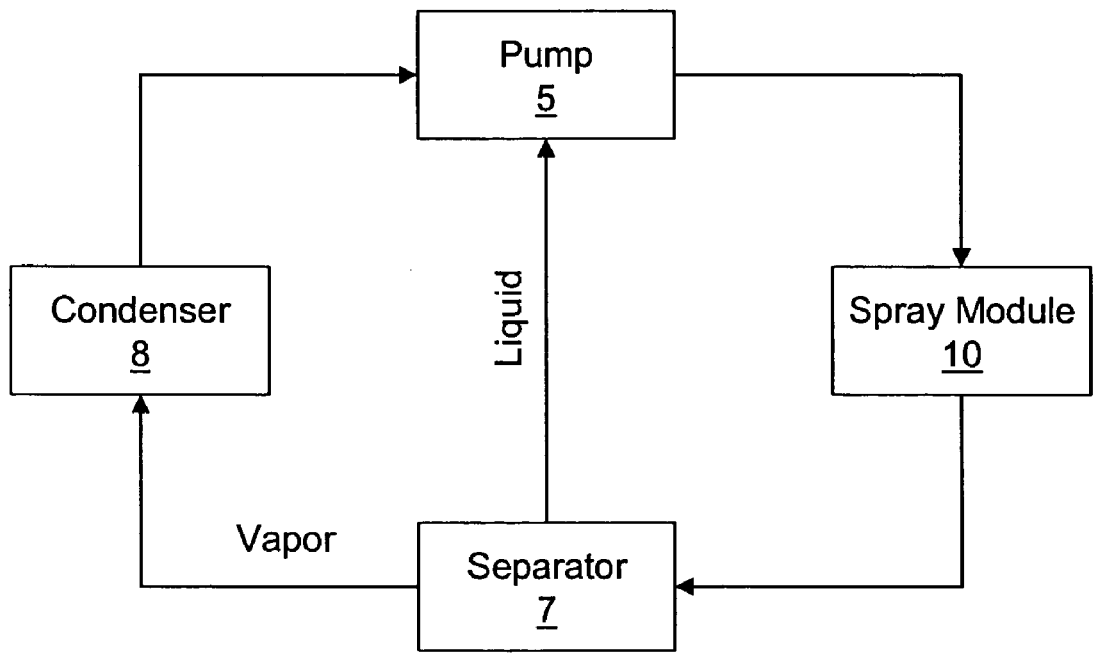
FIG. 11 is a block diagram of a spray cool system using a liquid and vapor separator.

Spray module 10 is part of a well known and understood two-phase cooling cycle (shown in FIG. 10). A pump 5 is used for supplying a cooling fluid at an optimal spray cooling flow rate and pressure level. The cooling fluid can be any one of the well known spray cooling fluids, including but not limited to FC-72, Fluorinert (a Trademark of 3M), water and water mixtures. From pump 5, the high pressure cooling fluid enters spray module 10 where it absorbs heat from chip 2. A condenser 8 cools the fluid and returns liquid to pump 5. The system and components of the spray cool system are well known and understood in the field, and thus, they will not be discussed in further detail.

Spray module 10, according to the present invention, has an outer housing 12 that provides the structural rigidity to the overall module. Housing 12 can be constructed from many materials, including aluminum and plastic. Ideally, housing 12 is designed to provide the ability to be molded or die-casted (as shown in FIG. 4), thus providing low manufacturing costs.

Figure 4:
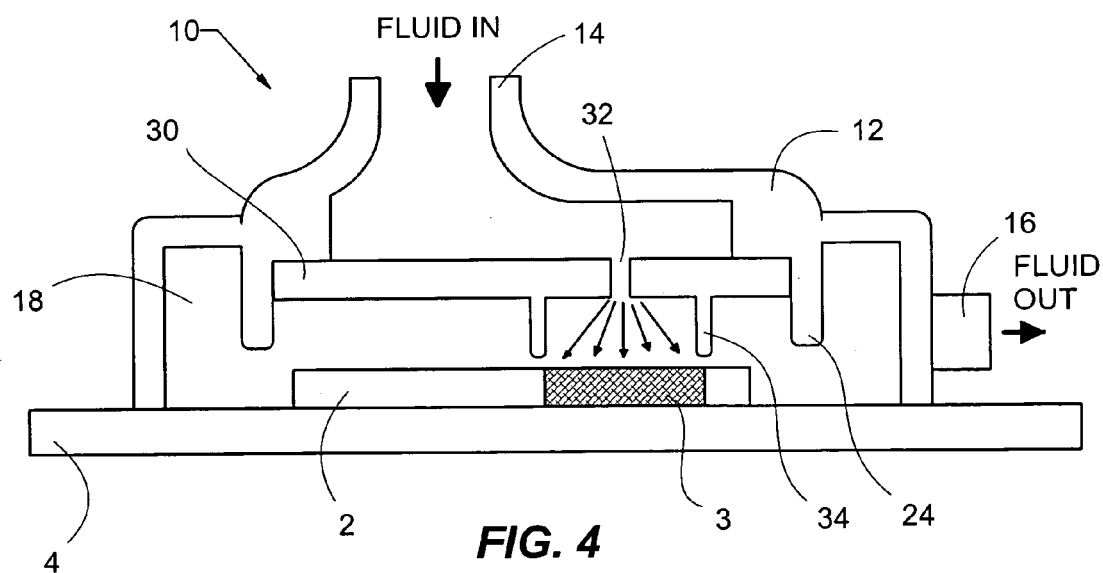
FIG. 4 is a section view, along line A—A of FIG. 3, showing the inside the a spray module according to the present invention.

Also shown in FIG. 4, a fluid supply enters inlet 14 located at the top of housing 12, by means of a supply tube (not shown). The connection between inlet 14 and the supply tube is preferably removable through the use of a common quick disconnect fitting. The coolant flowing through inlet 14 then enters a manifold area created between housing 12 and a spray plate 30.

Spray plate 30 provides the means for dispensing the cooling fluid onto chip 2. Plate 30 is shown inserted into a pocket within housing 12, where it can be glued, fastened or swaged into place. Due to the one piece design of housing 12, it is not necessary to provide a fluid tight seal between spray plate 30 and housing 12, but it is desirable to provide a tight fit and thus minimize pressure losses. Spray plate 30 contains one or more nozzles that provide the means of transforming the supply of coolant into one or more continuous droplet streams. In FIG. 4, an atomizer 32 is shown located over core 3. Although one atomizer 32 is shown, depending upon the type of fluid used, the size of core 3, and the spray cone angle of atomizer 32, there may be one or more atomizers placed above core 3. To minimize mixing between adjacent atomizers, it is preferable to use a single atomizer per hotspot. A method of creating spray plate 30 is described by U.S. Pat. No. 5,860,602 and U.S. Pat. No. 6,016,969 for a laminated pressure swirl atomizer. Another method is to insert button-style atomizers into plate 30. In the event that chip 2 produces highly variable heat fluxes as a function of time, that is it cycles from peak performance to "sleep" mode, it may be advantageous to make atomizer 32 variable and controllable as described by U.S. patent application Ser. No. 10/281,391. The variable atomizer in conjunction with an electronic control system makes it possible to achieve direct component temperature feedback and overall thermal performance control.

Figure 5:
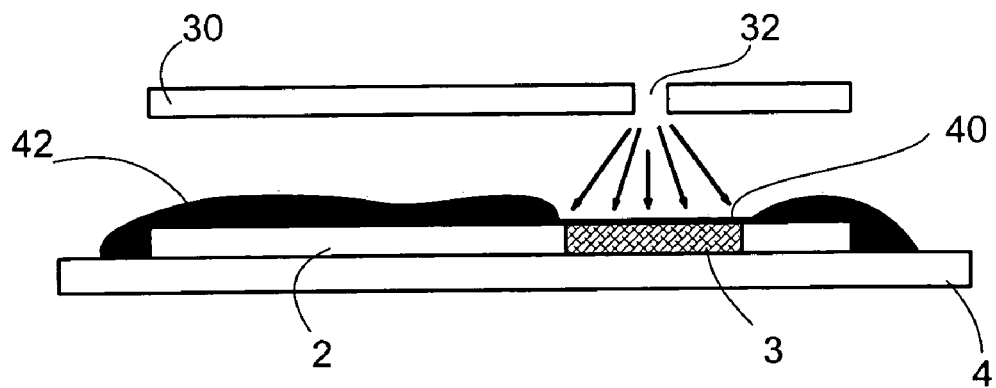
FIG. 5 is a partial view of FIG. 4 showing a spray plate located over the chip to be cooled according to the present invention.

As previously mentioned, it is highly desirable to remove heat directly from core 3 prior to it spreading to the rest of chip 2. Atomizer 32 provides the means for removing significant amounts of heat directly from core 3. Through the use of atomizer 32, droplet size, distribution and momentum can all be controlled and optimized in a fashion that provides a thin-film 40 over core 3, as shown in FIG. 5. As described by the dissertation by Tilton, the thickness of thin-film 40 can significantly affect the ability of the coolant to remove heat. Generally, the thinner thin-film 40 becomes the more heat it can remove.

Creation and optimization of thin-film 40 is application specific. If impinging droplets impact film 40 with too little momentum, the droplets will be entrained into the escaping vapor and they will not reach the cooling surface. If the impinging droplets have too much momentum, the droplets will splash from the surface and not contribute to cooling. Both conditions can not be completely avoided but should be minimized. In addition to the above optimization, ideally, impinging droplets will collide with thin-film 40 in a fashion that destroys nucleating bubbles. Nucleating bubbles aid in the desired vaporization of liquid coolant, but reduce the contact area between the higher conductive liquid and the lower conductive vapor. Ideally, nucleating bubbles are destroyed before they can achieve significant size.

Optimization of coolant dispensing characteristics may also yield a unique event that occurs when droplets impinge a flat surface, called hydraulic jump. This jump process occurs when a thin-film fluid flows radially and then jumps in height based upon its Froude number going from supercritical (thin-film) to subcritical (thick-film). As documented by the Tilton dissertation, a supercritical thin-film may be, but is not limited to, the range of 100 micrometer to 400 micrometers thick, and the jumped thick-film may be in the range, but is not limited to, 3000 micrometers to 4000 micrometers using water. A hydraulic jump provides the means of creating thin-film 40 and thick-film 42 and the ability to cool core 3 of chip 2 at a rate greater than the non-core areas of chip 2. A hydraulic jump may also provide a thermal buffer in the event that spray becomes momentarily interrupted.

As shown in FIG. 5, and in the fashion described above, atomizer 32 is located generally over core 3 so that thin-film 40 is also created directly over core 3. Rather than attempt to extend thin-film 40 over the entire surface of chip 2, as is attempted by the prior art, the present invention optimizes its spray characteristics over just core 3. This is likely to result in a jumped thick-film 42 over the non-core areas of chip 2. Wherein thin-film 40 may be capable of absorbing heat fluxes up to a thousand or more watts per square centimeter over the small area of core 3, thick-film 42 may be capable of efficiently and reliably providing heat removal rates generally less than 100 watts per square centimeter over the large area low-heat-flux zones of chip 2.

Figure 13:
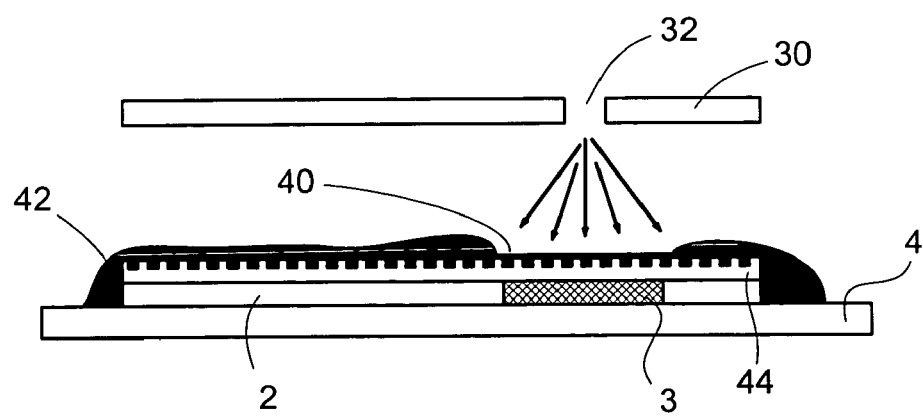
FIG. 13 is a side partial view of a spray cooled secondary etched microchannel plate, with the microchannels enlarged for clarity.

Heat removal rates of both zones, 40 and 42, may be improved the use of surface enhancements. One such enhancement is etched microchannels on the top surface of chip 2. The process of etching microchannels is described by U.S. Pat. No. 4,450,472 and U.S. patent application Ser. No. 10/052,859, both are herein incorporated by reference. Although these methods are disclosed as part of closed channel microchannel cooling systems, open etched microchannels may significantly increase the effectiveness of the present spray cooling invention. Open channel spray cooled microchannels are not limited by pressure drops created by the need for small hydraulic diameters, as is the case with closed microchannel systems. Open microchannel spray cooling is also limited by the need to use fluid manifolding. Therefore, open microchannel spray cooling may provide the ability to have smaller hydraulic diameters, and higher resulting heat transfer coefficients, than closed microchannel cooling systems. As an alternative surface enhancement embodiment and as shown in FIG. 13, a secondary etched microchannel plate 44 may be thermally attached to chip 2 providing the benefits of surface enhancements and the potential use of a non-dielectric fluid. Both open channel spray cooling microchannel methods provide increased nucleation sites, improved vaporization conditions and increased surface areas; all of which are known to benefit spray cooling.

Figure 6:
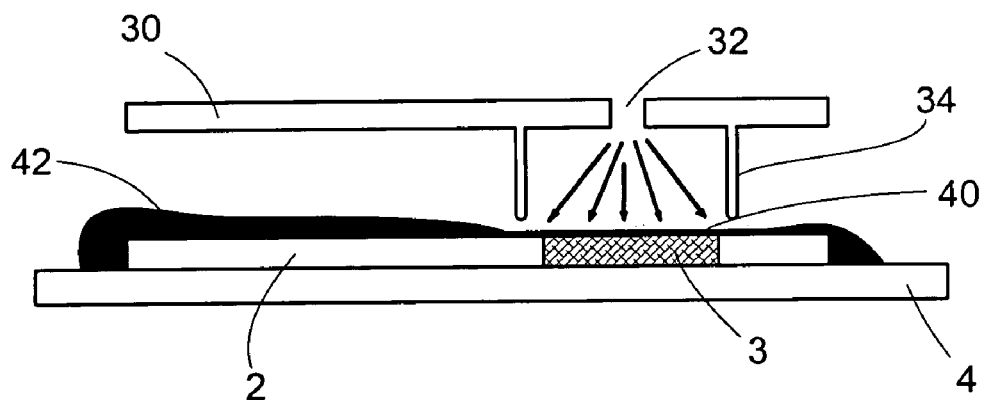
FIG. 6 is a side view of a spray plate with hotspot vapor management protrusions.
Figure 9:
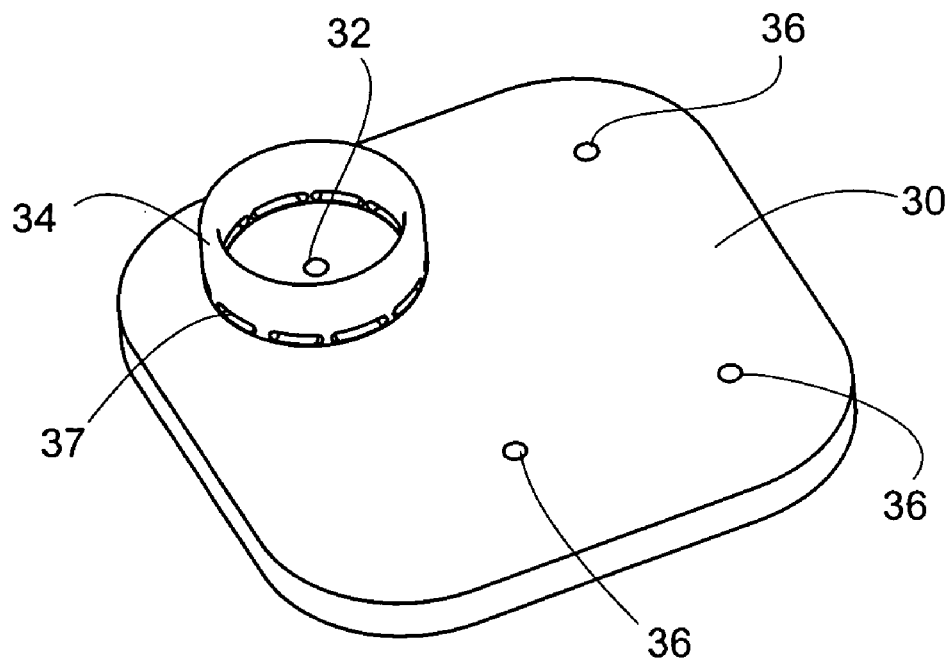
FIG. 9 is a bottom perspective view of a spray plate with a hotspot vapor management protrusion.

As an alternative embodiment of the present invention and shown in FIGS. 4 and 6, a hotspot vapor management protrusion 34 extends from spray plate 30 in the direction of and in a spaced apart relationship to chip 2. As described by U.S. Pat. No. 5,220,804 and U.S. Pat. No. 6,108,201, vapor management protrusion 34 forces the vapor within the system, and more particularly vapor in close proximity to the atomization zone, to flow downward and outward along thin-film 40. The result is a further thinning of thin-film 40 and increased heat removal rates. The gap between chip 2 and vapor management protrusion 34 is a variable of design, often optimized through experimentation, but ISR typically uses gaps between ½ mm and ¾ mm. In the event that multiple hotspots are present on a given chip, it may be desirable to have multiples of atomizer 32 and multiples of vapor management protrusion 34. Also located in protrusion 34, and shown in FIG. 9, is a plurality of vapor return orifices 37 which allow for the recirculation of vapor within spray module 10.

Figure 7:
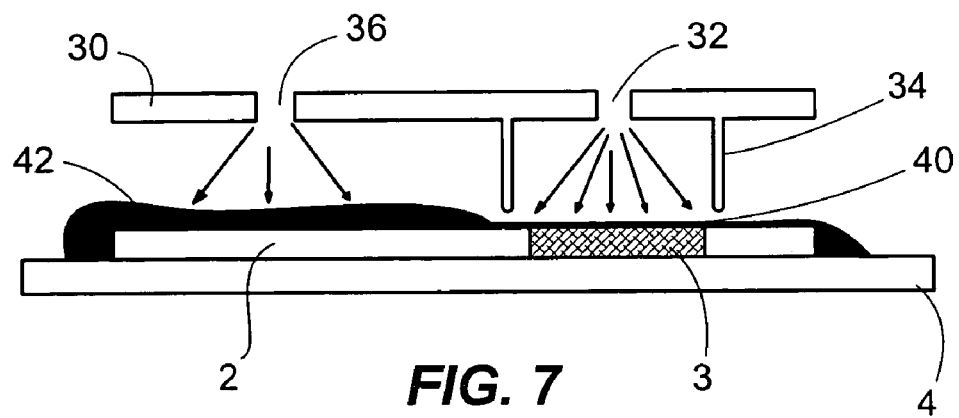
FIG. 7 is an alternative embodiment of the present invention showing a secondary nozzle spraying onto the thick-film.

In addition to cooling chip 2 by the above described fluid dispensing process, FIG. 7 shows a secondary nozzle 36 used to assist in the creation and performance of thick-film 42. In areas of moderate heat fluxes, such as critical memory areas, it may be desirable to increase the cooling in those areas by creating localized thinner zones within thick-film 42. In addition, nozzle 36 may simply add fluid to thick-film 42 in the event that atomizer 32 does not produce enough excess fluid to maintain thick-film 42 over the low heat flux areas of chip 2. Unlike the requirements placed on atomizer 32, nozzle 36 is not required to produce a thin evaporative film capable of very large heat fluxes. In this case, nozzle 36 may be, but is not limited to, an incremental sprayer, a drop on demand orifice, a jet orifice, a piezoelectric actuated jet impingement orifice, or an actuated atomizer. All methods provide the means of supplementing the cooling fluid to thick-film 42.

Figure 8:
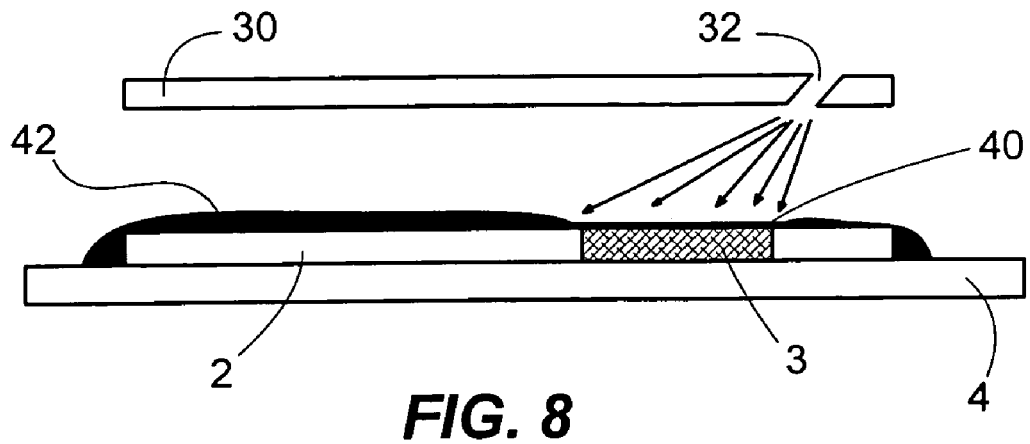
FIG. 8 is another alternative embodiment of the present invention showing an angled atomizer.

FIG. 8 shows another alternative embodiment of the present invention. In this embodiment, atomizer 32 dispenses fluid at a generally non-perpendicular angle to core 3. By spraying at a non-perpendicular angle to core 3, thick-film 42 is further encouraged to flow over and cover the non-hotspot areas of chip 2. This embodiment may also achieve benefits through they the addition of secondary nozzle 36 or vapor management protrusion 34. Angled spray cooling may also benefit from the addition of etched microchannels parallel to the direction of spray.

Figure 12:
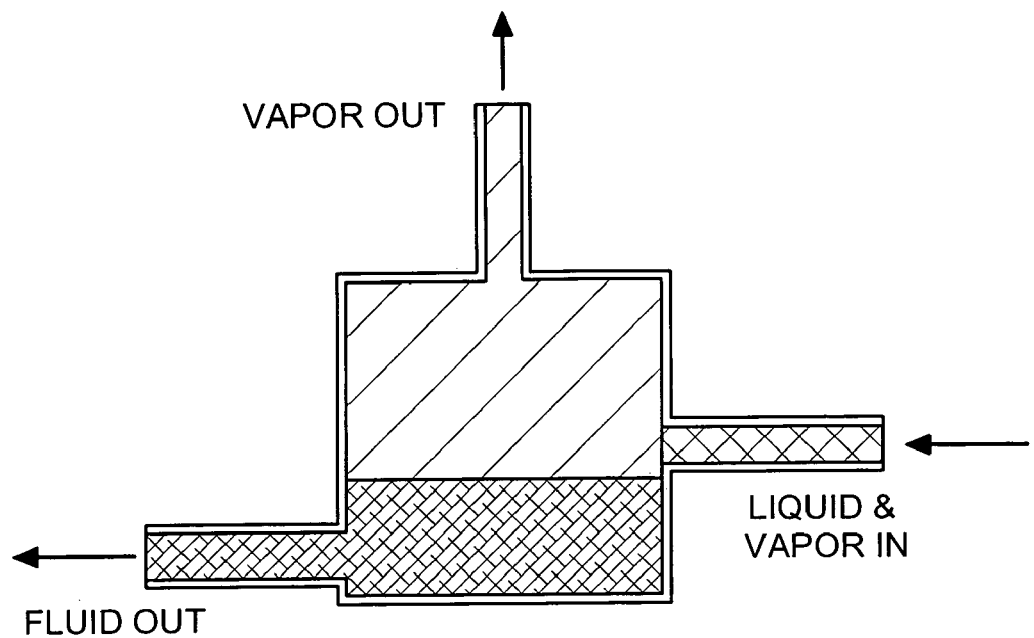
FIG. 12 is a side section view of a separator of FIG. 11.

Cooling fluid that exits spray module 10 is not likely to be a pure vapor, as ideal in terms of cycle efficiency. Although prior art systems try to optimize the spray system for complete fluid vaporization within module 10, the present invention is optimized for cooling the performance enhancing core of a chip. Although the higher performance of the present invention is at the cost of complicated two phase flow within condenser 8, FIG. 12 shows an addition to the system that simplifies its design and use. A separator 7 may be placed between condenser 8 and spray module 10. Separator 7 separates liquid from vapor and transfers the higher energy vapor to condenser 8 and the lower energy liquid to pump 5 (FIG. 13). In addition, vapor and liquid may be separated through the use of a spiral separator as described by U.S. Pat. No. 5,314,529. Liquid—vapor separation allows the size of condenser 8 to be minimized.

While the hot spot cooling system herein described constitute preferred embodiments of the invention, it is to be understood that the invention is not limited to these precise form of assemblies, and that changes may be made therein with out departing from the scope and spirit of the invention.

ELEMENTS BY REFERENCE NUMBER

| # | NAME |
|---|---|
| 1 | |
| 2 | Chip |
| 3 | Core |
| 4 | Substrate |
| 5 | Pump |
| 6 | |
| 7 | Separator |
| 8 | Condenser |
| 9 | |
| 10 | Spray Module |
| 11 | |
| 12 | Housing |
| 13 | |
| 14 | Inlet |
| 15 | |

16 Outlet
17
18
19
20
21
22
23
24
25
26
27
28
29
30 Spray Plate
31
32 Atomizer
33
34 Vapor Management Protrusion
35
36 Vapor Return Orifices
37
38
39
40 Thin-Film
41
42 Thick-Film
43
44 Microchannel Plate
45 Microchannels

We claim:

1. A thermal management system for an electronic device being cooled, said thermal management system comprising:
   a top surface of said electronic device orientated to receive a dispensed fluid from an at least one sprayer;
   a plurality of etched microchannels within said top surface and open to said sprayer; and
   wherein said dispensed fluid creates a thin evaporative cooling film on said top surface including said plurality of etched microchannels.

2. The thermal management system of claim 1, wherein said dispensed fluid is substantially directed down the length of said plurality of etched microchannels.

3. The thermal management system of claim 1, wherein said sprayer is an atomizer.

4. The thermal management system of claim 1, wherein said plurality of etched microchannels are positioned above a hotspot of said electronic device.

5. The thermal management system of claim 1, wherein said plurality of etched microchannels each have a width generally less than 200 microns.

6. A thermal management system for an electronic device being liquid spray cooled, said thermal management system comprising:
   a plate having a top surface and a bottom surface, said bottom surface bonded to said electronic device, said top surface orientated to receive a dispensed fluid from an at least one sprayer;
   a plurality of etched microchannels within said top surface and open to said sprayer; and
   wherein said dispensed fluid creates a thin evaporative cooling film on said top surface including said plurality of etched microchannels.

7. The thermal management system of claim 6, wherein said dispensed fluid is substantially directed down the length of said plurality of etched microchannels.

8. The thermal management system of claim 6, wherein said sprayer is an atomizer.

9. The thermal management system of claim 6, wherein said plurality of etched microchannels are positioned above a hotspot of said electronic device.

10. The thermal management system of claim 6, wherein said plurality of etched microchannels each have a width generally less than 200 microns.

* * * * *